United States Patent [19]

Kanzaki et al.

[11] 4,377,903
[45] Mar. 29, 1983

[54] METHOD FOR MANUFACTURING AN I²L SEMICONDUCTOR DEVICE

[75] Inventors: Koichi Kanzaki, Kawasaki; Minoru Taguchi, Omiya, both of Japan

[73] Assignee: Tokyo Shibaura Denki Kabushiki Kaisha, Kawasaki, Japan

[21] Appl. No.: 236,248

[22] Filed: Feb. 18, 1981

[30] Foreign Application Priority Data

Feb. 18, 1980 [JP] Japan ............... 55-18690

[51] Int. Cl.³ .............. H01L 21/26; H01L 21/225
[52] U.S. Cl. ................. 29/577 C; 29/591; 148/187; 148/188; 148/190
[58] Field of Search ............ 148/187, 175, 188, 190; 29/571, 577 C, 591; 357/92

[56] References Cited

U.S. PATENT DOCUMENTS 4,183,037 1/1980 LeCan et al. ............. 357/92 X
4,273,805 6/1981 Dawson et al. ............ 148/187 X

OTHER PUBLICATIONS

Tang et al., IEDM Technical Digest, Dec. 3-5, 1979, pp. 201-204.
IBM Tech. Discl. Bulletin, vol. 22, No. 7, Dec. 1979, pp. 2786-2788.
Feth et al., "Polysilicon Merger Transistor Logic Device", 22 IBM Tech. Disclosure Bull. 3388-9 (Jan. 1980).
Middelhoek et al., "Polycrystalline Silicon as Diffusion Source and Interconnect Layer in I²L Realizations," 12 IEEE J. SOLID-STATE CIRCUITS 135-38 (Apr. 1977).
Feth et al., "Layout Image for Merged Transistor Logic", 22 IBM Tech. Disclosure Bull." 2948-51 (Dec. 1979).
Isaac et al., "Method of Fabricating a Self-Aligned Vertical PNP Transistor", 22 IBM Tech. Disclosure Bull. 3393-96 (Jan. 1980).

Primary Examiner—G. Ozaki
Attorney, Agent, or Firm—Finnegan, Henderson, Farabow, Garrett & Dunner

[57] ABSTRACT

An oxide layer is partially formed on an n-type region surrounded by a field oxide region. A base region of a switching transistor is formed in the n-type region using as a mask the oxide layer. Arsenic-doped polysilicon layers are selectively formed simultaneously on the surfaces of the oxide layer and the base region. Using the polysilicon layers as a mask, the emitter and collector regions of an injector transistor and the external base region of a switching transistor are formed in the n-type region and the base region respectively. Arsenic doped into the polysilicon layers is diffused into the base region, so that the collector regions of the switching transistor are self-aligned with the polysilicon layers.

4 Claims, 9 Drawing Figures

METHOD FOR MANUFACTURING AN I²L SEMICONDUCTOR DEVICE

The present invention relates to a method for manufacturing a semiconductor device and, more particularly, to a method for manufacturing an integrated injection logic semiconductor device.

The integrated injection logic (I²L) gate, having many attractive features such as high speed operation, low power consumption, high packing density, and coexistence with linear transistors, has been intensively studied and developed to further improve the operation speed and the packing density. An I²L gate having excellent features is disclosed in IEDM Technical Digest, Dec. 3 to 5, 1979, pp. 201 to 204. In the I²L gate a vertical or switching transistor is provided at both sides thereof, not with the low resistance rail regions, but direct contact with an oxide isolation region. The extrinsic base regions between the collector regions are commonly connected by an overlying aluminium layer. With such a structure the I²L gate has no need for the low resistance rail regions. For this reason, the area of the base region of the switching transistor is extremely small, and, therefore, the storage time of minority carriers becomes small. As a result, the packing density as well as the operation speed of the I²L gate is improved.

In manufacturing the I²L gate, however, the base region of the lateral or injector transistor, is formed by a masked boron implantation, and then the step of forming the collector regions of the switching regions is performed. That is, arsenic-doped polysilicon layers are formed and patterned. Therefore, in forming polysilicon layers after the formation of the base of the injector transistor, some margin for an inevitable error in the masking must be provided in advance. Because of the use of the margin, the collector region of the switching transistor, which is the base contact region most adjacent to the injector transistor formed right under the arsenic-doped polysilicon layer, has a wide gap with respect to the base region of the injector transistor. The wider gap hinders the further improvement of the packing density and operation speed of the I²L gate.

Accordingly, an object of the present invention is to provide a method for manufacturing a semiconductor device which enables the I²L elements to have a higher packing density and operation speed.

According to the present invention, a mask is partially formed by an insulating film on a semiconductor island surrounded by a field oxidation layer. Impurity is doped into the semiconductor island through a window of the mask to form a base region of the switching transistor. In the next step, impurity-doped polysilicon layers are formed on the base region and the insulating layer surface of the mask. With a mask of the polysilicon layers, impurity is doped into the semiconductor island and the base region to form the emitter and collector regions of the injector transistor, and an external base of the switching transistor. The collector regions of the switching transistor are formed by diffusing the impurity contained in the impurity-doped polysilicon layers on the base region thereunder.

This invention can be more fully understood from the following detailed description when taken in conjunction with the accompanying drawings, in which.

Figure 1A:
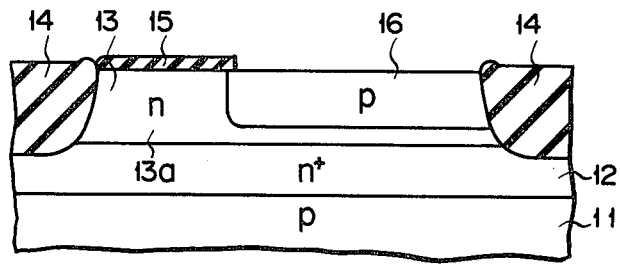
FIGS. 1A to 1F show semiconductor structures in the respective manufacturing steps of an I²L device according to an embodiment of a method for manufacturing a semiconductor device of the present invention.

A method for manufacturing a semiconductor device according to the present invention will be described referring to FIGS. 1A to 1F. In the step shown in FIG. 1A, an N+ buried region 12 is formed on a p-type semiconductor silicon substrate 11. An n-type epitaxial layer 13 is further formed on the buried region 12. A field oxide layer 14 is formed on the epitaxial layer 13 to produce at least one n-type island region 13a in the epitaxial layer 13. An oxide layer 15 is partially formed on the surface of the island region 13a. With a mask of the oxide layer 15, a p-type impurity such as boron is doped into the island region 13a to form a p-type region 16 in the island region 13a.

The p-type region 16, may be formed by the following process. An oxide layer 15 is formed on the entire surface of the island region 13a. On the oxide layer 15 is partially formed a resist film. Using the resist film as a mask, a p-type impurity such as boron is doped in the island region 13a to form the p-type region 16 in the island region 13a. That part of the oxide layer 15 which is disposed on the p-type region 16 is then etched away.

Figure 1B:
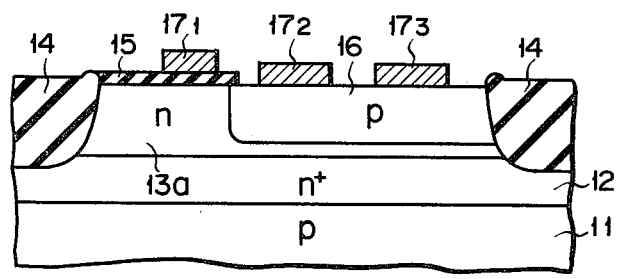
Figure 2:
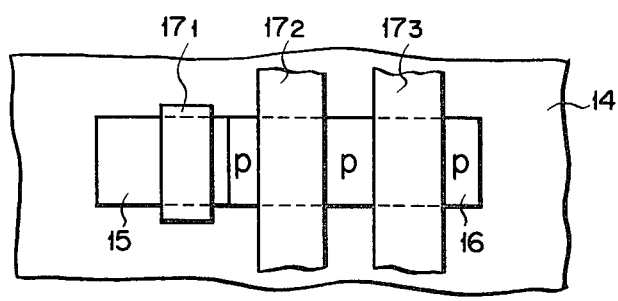
FIG. 2 shows a plan view of the semiconductor structure shown in FIG. 1B.

In the step shown in FIG. 1B, polysilicon layers $17_1$ to $17_3$ which are doped with arsenic, for example, are selectively formed on the surfaces of the oxide layer 15 and p-type region 16. The polysilicon layers $17_1$ to $17_3$ cross the oxide layer 15 and p-type region 16, extending to the field oxide layer 14, as is illustrated in FIG. 2.

Figure 1C:
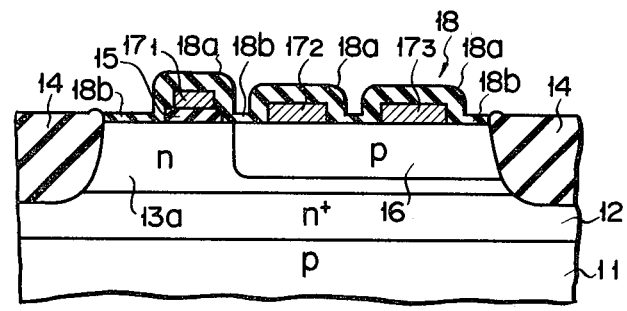

In the step shown in FIG. 1C, the oxide layer 15 is etched away with a mask of the polysilicon layer $17_1$. Then, an oxide layer 18 having thick layer portions 18a of about 3,000 Å which enclose the polysilicon layers $17_1$ to $17_3$ and thin layer portions 18b of about 300 Å on the chip surface is formed by wet oxidation at low temperature.

Figure 1D:
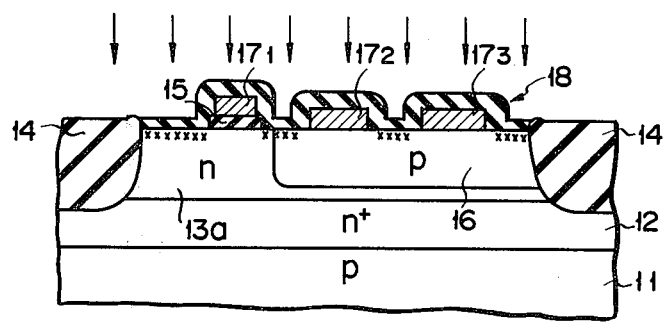
Figure 1E:
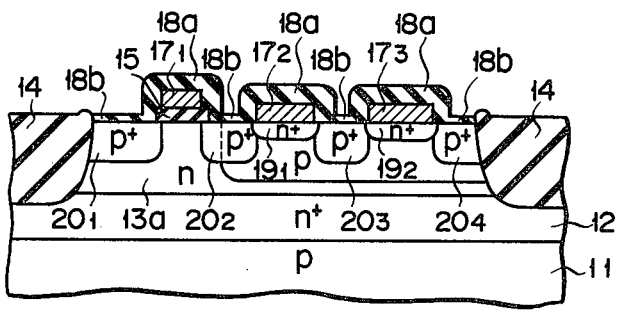

As shown in FIG. 1D, boron ions, for example, are injected into the island region 13a and the p-type region 16, using the polysilicon layers $17_1$ to $17_3$ and the oxide layer 18 as a mask. In the next step, the semiconductor chip is subjected to a thermal process. As a result of the heat treatment, arsenic contained in the polysilicon layers $17_2$ and $17_3$ is diffused into the p-type region 16, as shown in FIG. 1E, to form n+-type regions $19_1$ and $19_2$. At the same time, injected boron is diffused into the island region 13a and the first region 16 to form p+-type regions $20_1$ to $20_4$.

Figure 1F:
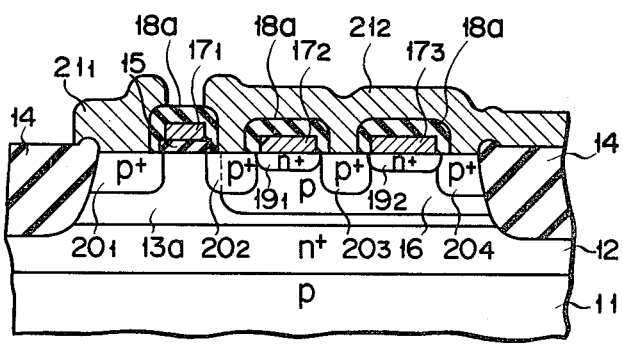

In the step shown in FIG. 1F, electrodes $21_1$ and $21_2$ are formed on the p+-type regions $20_1$ to $20_4$. In forming the electrodes, contact holes are first formed on the p+-type regions $20_1$ to $20_4$. As mentioned above, the layer portions 18a on the polysilicon layers $17_1$ to $17_3$ are thick while the layer portions 18b are thin. Therefore, by merely properly controlling the etching time rather than by any mask process, the thin layer portions 18b are etched away to form contact holes, while the polysilicon layers $17_1$ to $17_3$ are left unexposed. After formation of the contact holes, aluminum is deposited and patterned over the surface of the semiconductor chip.

Figure 3:
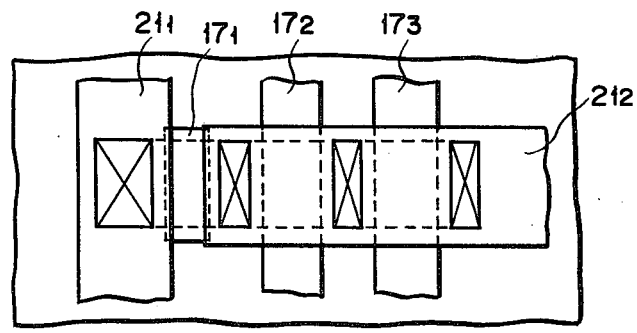
FIG. 3 is a plan view of the semiconductor structure shown in FIG. 1F.

In the semiconductor device thus manufactured, the p-type region 16 serves as an internal base of a vertical or switching transistor, of the I²L gate. The p+-type regions $20_3$ and $20_4$ serve as an external base of the switching transistor. As seen from FIG. 3 illustrating a plan view of the I²L gate in FIG. 1F, the collector electrode $21_2$ crosses the polysilicon layers $17_2$ and $17_3$ to contact the external regions $20_2$, $20_3$ and $20_4$ on both sides of the collector regions $17_2$ and $17_3$.

As described above, since the emitter and collector of the injector transistor and the external collector of the switching transistor are concurrently formed using as a mask the polysilicon layers the intervals between the adjacent polysilicon layers may be set to the minimum value determined by the mask dimension for patterning the polysilicon layers. Therefore, the lateral dimensions of the I²L gate can be reduced considerably, and therefore, the area of the base region of the switching transistor can also be reduced, resulting in further speeding up the operation speed of the device. The thick and thin portions $18a$ and $18b$ of oxide layer 18 eliminates the need for a masking step in forming the contact holes for the p+-type regions $20_1$ and $20_2$. That is, the contact holes may be made by properly controlling the etching time to etch away the thin layer portions $18b$. This contributes to the improvement of the packing density of the device.

Figure 4:
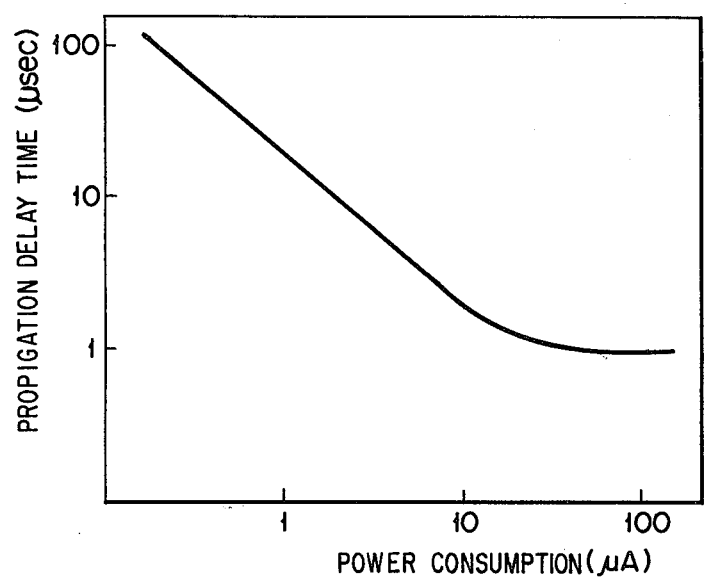
FIG. 4 is a characteristic curve of the I²L device.

The propagation delay time versus power consumption of the I²L gate prepared by the above-mentioned manufacturing method was measured by using a ring oscillator. The result of the measurement is illustrated in FIG. 4. As seen from FIG. 4, the minimum value of the propagation delay time per gate is approximately 1 $\mu$s and is a remarkable improvement over the conventional one.

In the embodiment described above, the p+-type layers $20_1$ and $20_4$ are formed by an ion injection method. Those layers may also be formed by impurity doping using an ordinary thermal diffusion method after the oxide layer etching. Additionally, for forming the p+-type layers $20_1$ to $20_4$, boron-doped polysilicon layers $21_1$ and $21_2$ may be used as a diffusion source. While in the above embodiment, the step of impurity diffusion from polysilicon layers $17_2$ and $17_3$ and the step of diffusion of p+-type regions $20_1$ to $20_4$ are simultaneously performed, those steps may be performed separately. Furthermore, the polysilicon layer $17_1$ not used as the diffusion source may be used for wiring.

What we claim is:
1. A method for manufacturing a semiconductor device comprising the steps of:
   a. forming at least one island region of a first conductivity type surrounded by a field insulation region on a semiconductor layer of said first conductivity type;
   b. forming a first insulating film on a part of the surface of said first conductivity type island region;
   c. forming a first region of a second conductivity type in said island region not covered by said first insulating film;
   d. forming discrete impurity-doped polysilicon layers of said first conductivity type on the surfaces of said first insulating film and said second conductivity type first region, said polysilicon layers crossing said first insulating film and said second conductivity type first region;
   e. eliminating any exposed parts of said first insulating film after the formation of said polysilicon layers;
   f. covering said polysilicon layers with individual thick insulating films;
   g. forming second regions of said second conductivity type by doping an impurity of said second conductivity type into said first conductivity type island region and said second conductivity type first region using as a mask said polysilicon layers covered with said thick insulating films;
   h. forming third regions of said first conductivity type by diffusing said impurity doped in said polysilicon layers into portions of said first region beneath said polysilicon layers;
   i. connecting said second regions in said first region, which are not covered with said polysilicon layers, by a conductive layer; and
   j. depositing a conductive layer on said second region in said island region.

2. A method for manufacturing a semiconductor device comprising the steps of:
   a. forming at least one island region of a first conductivity type surrounded by a field insulation region on a semiconductor layer of said first conductivity type;
   b. forming a first insulating film on a part of the surface of said first conductivity type island region;
   c. forming a second conductivity type internal base region of a switching transistor in said island region not covered by said first insulating film;
   d. forming discrete impurity-doped polysilicon layers of said first conductivity type on the surfaces of said first insulating film and said internal base region, said polysilicon layers crossing said first insulating film and said internal base region;
   e. eliminating any exposed parts of said first insulating film after the formation of said polysilicon layers;
   f. covering said polysilicon layers with individual thick insulating layers;
   g. forming the emitter and collector regions of an injector transistor and the external base regions of said switching transistor in said island region and said internal base region respectively using said polysilicon layers covered with said thick insulating layers as a mask, and forming collector regions of said switching transistor by diffusing said impurity doped in said polysilicon layers into portions of said internal base region beneath said polysilicon layers;
   h. connecting said external base regions by a conductive layer; and
   i. depositing a conductive layer on said emitter region.

3. A method for manufacturing a semiconductor device according to claim 2, wherein the emitter and collector regions of said injector transistor and the external base regions of said switching transistor are formed by doping an impurity into said island region and said internal base region respectively using as a mask said polysilicon layers enclosed by said thick insulating films.

4. A method for manufacturing a semiconductor device according to claim 3, wherein said impurity is doped by an ion implantation.

* * * * *